United States Patent
Banin et al.

(10) Patent No.: US 9,071,304 B2
(45) Date of Patent: Jun. 30, 2015

(54) DIGITAL-TO-TIME CONVERTER AND METHODS FOR GENERATING PHASE-MODULATED SIGNALS

(71) Applicant: Intel IP Corporation, Santa Clara, CA (US)

(72) Inventors: Rotem Banin, Even-Yehuda (IL); Ofir Degani, Haifa (IL); Markus Schimper, Moosinning (DE); Ashoke Ravi, Hillsboro, OR (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 13/969,132

(22) Filed: Aug. 16, 2013

(65) Prior Publication Data

US 2015/0049840 A1    Feb. 19, 2015

(51) Int. Cl.
*H04B 1/04* (2006.01)
*H03M 1/66* (2006.01)

(52) U.S. Cl.
CPC .............. *H04B 1/0475* (2013.01); *H03M 1/66* (2013.01); *H04B 2001/045* (2013.01)

(58) Field of Classification Search
USPC .................................................. 375/308, 306
See application file for complete search history.

(56) References Cited

U.S. PATENT DOCUMENTS

| 8,222,966 B2 | 7/2012 | Ravi et al. |
| 2012/0119931 A1* | 5/2012 | Menkhoff et al. ............ 341/152 |
| 2014/0176201 A1* | 6/2014 | Weltin-Wu et al. ........... 327/115 |

* cited by examiner

*Primary Examiner* — Kabir A Timory
(74) *Attorney, Agent, or Firm* — Schwegman Lundberg & Woessner, P.A.

(57) ABSTRACT

Embodiments of a digital-to-time converter (DTC) and methods for generating phase-modulated signals are generally described herein. In some embodiments, a divide by 2N+/−1 operation on an oscillator signal generates first and second divider signals, the first divider signal is sampled to provide a rising-edge correlated signal, a divider unit output signal is sampled to provide a falling edge correlated signal, and either the second divider signal or a delayed version of the second divider signal is provided as the divider unit output signal. A selection between the rising-edge and the falling-edge correlated signals generates edge signals. A fine phase-modulated output signal is generated based on an edge interpolation between a first and second edge signals.

16 Claims, 2 Drawing Sheets

DIGITAL-TO-TIME CONVERTER AND METHODS FOR GENERATING PHASE-MODULATED SIGNALS

TECHNICAL FIELD

Embodiments pertain to digital-to-time converters (DTCs) and generating phase-modulated signals. Some embodiments relate to digital transmitters. Some embodiments relate to wireless communications. Some embodiments relate to the communication of wideband signals in accordance with an IEEE 802.11ac standard or one of the 3GPP LTE standards.

BACKGROUND

Conventional digital transmitters include a digital-to-time converters (DTC) that modulates the LO carrier with the phase information of the signal, and a Digital Power Amplifier (DPA) that modulates the amplitude on the phase modulated LO and combines (reconstructs) the original signal. One of the challenges for digital transmitter architectures arise from wideband signals utilized in many current communication protocols, such as Wifi 802.11 ac, which have signal bandwidths ranging from 20 MHz to 160 MHz, and 3GPP LTE, which has signal bandwidths of up to 40 MHz. These wide bandwidths may require the DTC cover up to 360 degrees or more of dynamic range and a 14 bit resolution. Some conventional techniques, which use a large N-way multiplexer (MUX) and digitally controlled delay lines (DCDL), are cumbersome, slow, noisy and/or add non-linearities, resulting in poor performance and increased power consumption.

Thus there are general needs for improved DTCs can provide up to 360 degrees or more of dynamic range and a 14 bit resolution.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
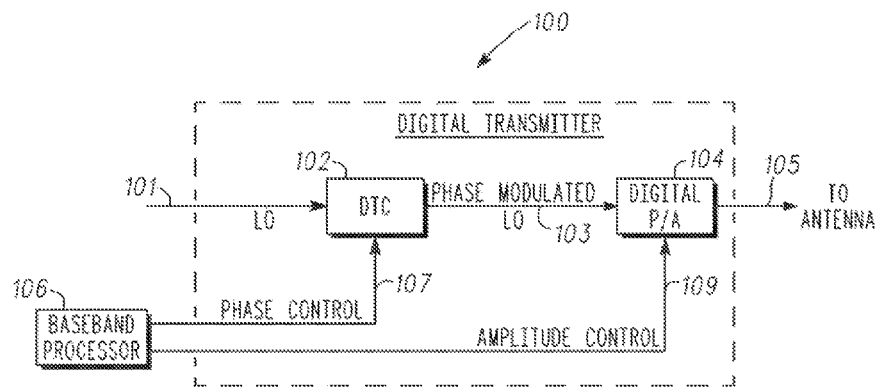
FIG. 1 is a block diagram of digital transmitter in accordance with some embodiments.

FIG. 1 is a block diagram of a digital transmitter 100 in accordance with some embodiments. The digital transmitter 100 comprises a digital-to-time converter (DTC) 102 that is configured to receive a phase data signal 107 from a baseband processor 106 and is to provide a phase-modulated signal 103 for use generating wireless signals 105 for transmission by one or more antennas. As illustrated in FIG. 1, a digital power amplifier (P/A) 104 may be arranged to generate the wireless signals 105 based on the phase information of the phase-modulated signal 103 and an amplitude control signal 109 from the baseband processor 106.

In some embodiments, a divide by 2N+/−1 operation may be performed on a VCO signal to generate first and second divider signals, the first divider signal may be sampled to provide a rising-edge correlated signal, a divider unit output signal may be sampled to provide a falling edge correlated signal, and either the second divider signal or a delayed version of the second divider signal may be provided as the divider unit output signal. A selection between the rising-edge correlated signal and the falling-edge correlated signal may be based on first and second predetermined bits of a control word to generate the first edge signal, and a selection between the rising-edge correlated signal and the falling-edge correlated signal may be based only on the second predetermined bits of the control word. The output of the second selection unit may be delayed by a quarter VCO cycle to generate a second edge signal. The phase-modulated signal 103 may be generated based on an edge interpolation between a first and second edge signals. In some embodiments, the phase-modulated signal 103 may be a phase modulated local-oscillator (LO) signal.

Figure 4:
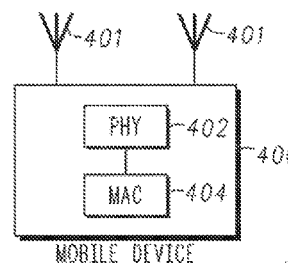
FIG. 4 is a block diagram of a mobile device in accordance with some embodiments.

In some embodiments, digital transmitter 100 may be part of a portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a medical device (e.g., a heart rate monitor, a blood pressure monitor, etc.), or other device that may receive and/or transmit information wirelessly. In some embodiments, the portable wireless communication device may include one or more of a keyboard, a display, a non-volatile memory port, multiple antennas, a graphics processor, an application processor, speakers, and other mobile device elements. The display may be a LCD screen including a touch screen. In some embodiments, the digital transmitter 100 may be part of a mobile communication device and is coupled to one or more antennas configured for transmission of orthogonal frequency division multiplexed (OFDM) signals in a 3GPP LTE network. An example of a suitable mobile device is illustrated in FIG. 4 described below. In some embodiments, the digital transmitter 100 may be a digital polar transmitter (DPTX), although the scope of the embodiments is not limited in this respect.

The antennas may comprise one or more directional or omnidirectional antennas, including, for example, dipole antennas, monopole antennas, patch antennas, loop antennas, microstrip antennas or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, the antennas may be effectively separated to take advantage of spatial diversity and the different channel characteristics that may result between each of antennas and the antennas of a transmitting station.

Figure 2:
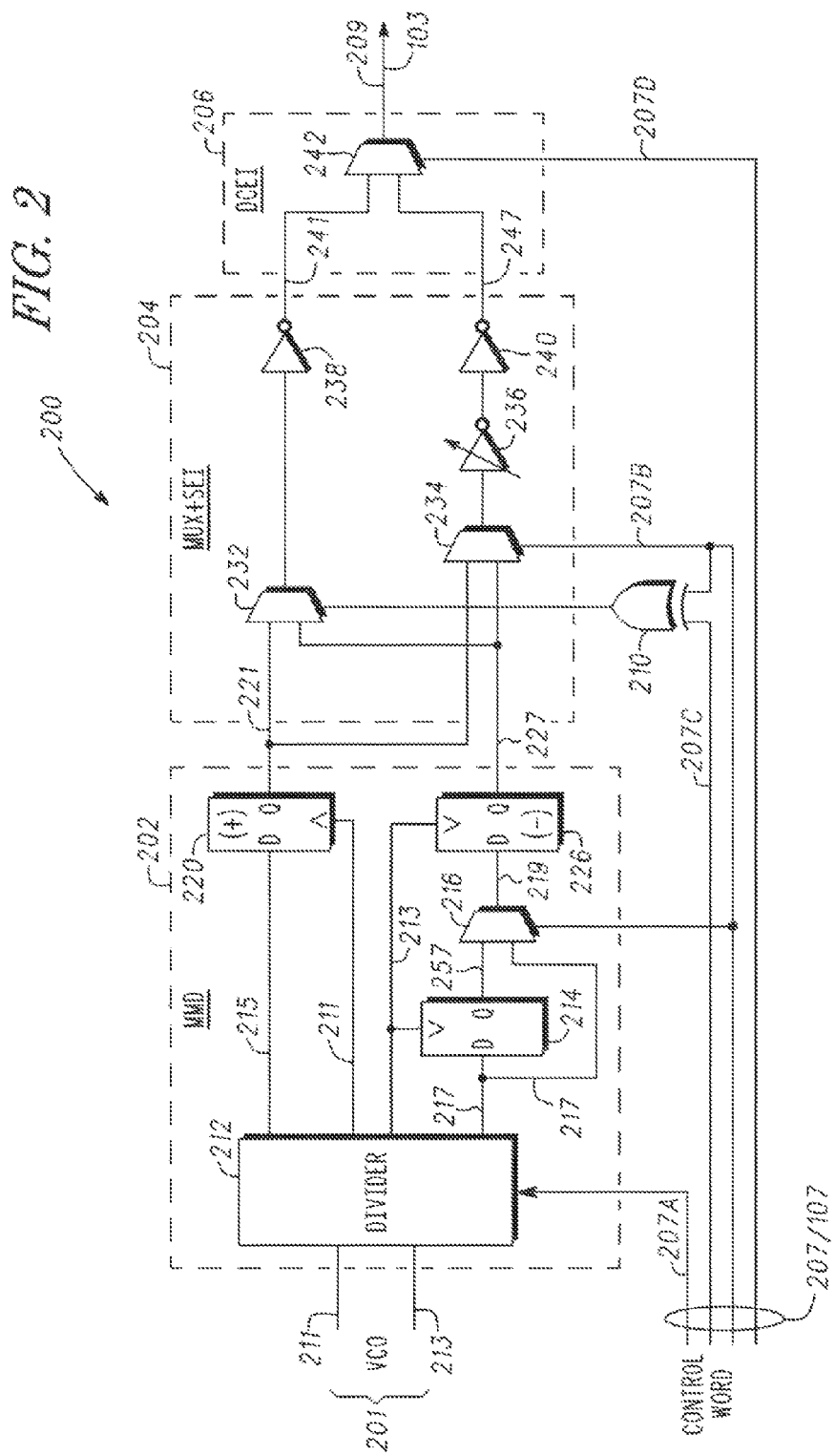
FIG. 2 is a block diagram of a DTC in accordance with some embodiments.

FIG. 2 is a block diagram of a DTC 200 in accordance with some embodiments. DTC 200 is arranged to generate a phase-modulated local oscillator (LO) signal 209 from a voltage-controlled oscillator (VCO) signal 201 based on control words 207. The DTC 200 may be suitable for use as the DTC 102 (FIG. 1), although other configurations may also be suitable. The control words 207 may be considered a phase data signal, such as phase data signal 107 (FIG. 1). The phase-modulated output signal 209 may correspond to the phase-modulated signal 103 (FIG. 1).

The DTC 200 may comprise a programmable divider 212 to perform a divide by (2N+/−1) operation on a VCO signal 201 to generate divider signals 215 and 217. The VCO signal 201 may comprise a VCO_p signal 211 and a VCO_n signal 213. The divider signals 215 and 217 may be at 1/(2N+/−1) the frequency of the VCO signal 201.

The DTC 200 also comprises resample circuitry comprising a rising-edge resampling flip-flop 220 (the Q-FF) (i.e., rising-edge resampling logic) and a falling-edge resampling flip-flop 226 (the I-FF) (i.e., falling-edge resampling logic). The programmable divider 212 and the resampling flip-flops 220, 226 may be part of a multi-modulus divider (MMD) 202 although this is not a requirement.

The resample circuitry may be arranged to sample the divider signals 215 and 217 and retime to reduce jitter (noise) and to provide output signals that have a time difference of half a VCO cycle (i.e., the time difference between the rising (or falling) edge of VCO_P signal 211 and the rising (or falling) edge of VCO_n signal 213. These output signals may be referred to as coarse phase-modulated signals that comprise a rising-edge correlated signal 221 (the Q-signal) and a falling-edge correlated signal 227 (the I-signal).

The DTC 200 also comprises a divider multiplexer 216 (i.e., a divider unit) and a delay flip-flop 214. Divider multiplexer 216 and delay flip-flop 214 may be part of the MMD 202, although this is not a requirement. The delay flip-flop 214 may be arranged to delay the divider signal 217 by +/− half a VCO cycle (i.e., one VCO cycle) and the divider multiplexer 216 may be arranged to select between divider signal 217 and the delayed version of divider signal 217 (i.e., signal 257) based on control word bit 207B.

In these embodiments, the positive-edge resampling flip-flop 220 (the Q-FF) resamples the divider signal 215 on a rising (+) edge of the VCO signal 201 and generates the rising-edge correlated signal 221. The falling-edge resampling flip-flop 226 (the I-FF) resamples signal 219 on the falling (−) edge of the VCO signal 201 and generates the falling-edge correlated signal 227. Signal 219 may be either the divider signal 217 or the delayed version of the divider signal 217.

By the proper selection of the output of divider multiplexer 216, the falling-edge resampling flip-flop 226 may output the falling-edge correlated signal 227 which may be aligned to the falling edge either before or after the VCO signal's rising edge. For example, flip-flop 226 may output an $I_1$ signal as the falling-edge correlated signal 227 that is aligned to the falling edge before the VCO signal's rising edge when the divider multiplexer 216 selects signal 217. Flip-flop 226 may output an $I_2$ signal as the falling-edge correlated signal 227 that is aligned to the falling edge after the VCO signal's rising edge when the divider multiplexer 216 selects signal 257, which is the output of delay flip-flop 214. In this way, divider multiplexer 216 may be used to align the falling-edge correlated signal 227 to the falling edge either before or after the VCO rising edge based on control word 207B.

The DTC 200 may also include multiplexing circuitry 204 and a digitally-controlled edge interpolator (DCEI) 206. The multiplexing circuitry 204 generates edge signals 241 and 247 for the DCEI 206 based on the rising-edge correlated signal 221, the falling-edge correlated signal 227 and control word bits 207B and 207C.

As illustrated in FIG. 2, the multiplexing circuitry 204 may comprise a first multiplexer 232 (i.e., a first selection unit) and a second multiplexer 234 (i.e., a second selection unit). The first and second multiplexers 232 and 234 may be 2:1 multiplexers as shown. The first multiplexer 232 may be arranged to select between the rising-edge correlated signal 221 and the falling-edge correlated signal 227 based on an exclusive-or (XOR) of control word bits 207B and 207C of the control word 207. The second multiplexer 234 may be arranged to select between the rising-edge correlated signal 221 and the falling-edge correlated signal 227 based on control word bit 207B. The multiplexing circuitry 204 includes a delay element 236 to delay signal the output of multiplexer 234 by a quarter VCO cycle.

In some embodiments, the multiplexing circuitry 204 may include a Self-Edge Interpolator (SEI). In these embodiments, the delay element 236 creates the delay in accordance with a delay interpolation technique. In some embodiments, the multiplexing circuitry 204 may also include inverters and or buffers 238 and 240 to provide first and second edge signals 241 and 247 as illustrated.

The selection of the rising-edge correlated signal 221 (the Q-signal) by multiplexer 232 allows the DCEI inputs to cover $T_{VCO}/4$ to $T_{VCO}/2$. The selection of the rising-edge correlated signal 221 by multiplexer 234 allows the DCEI inputs cover $T_{VCO}/2$ to $3*T_{VCO}/4$. The selection of the falling-edge correlated signal 227 (either the $I_1$ signal of the $I_2$ signal) by multiplexer 232 allows the DCEI inputs to cover $3*T_{VCO}/4$ to $1*T_{VCO}$. Since the delay element 236 is arranged to delay signal the output of multiplexer 234 by a quarter VCO cycle (e.g., by $T_{VCO}/4$), the DCEI 206 may interpolate over a range including from $T_{VCO}/4$ to $T_{VCO}/2$. In the way, the first and second multiplexers 232 are 234 are able to quantize the rising-edge correlated signal 221 and the falling-edge correlated signal 227 to a quarter of a VCO cycle.

By the proper selection of the output of the divider multiplexer 216, the falling-edge resampling flip-flop 226 may provide the falling-edge correlated signal 227 which is aligned to the falling edge either before or after the VCO signal's rising edge. For example, falling-edge resampling flip-flop 226 may output an $I_1$ signal as falling-edge correlated signal 227 which may be aligned to the falling edge before the VCO signal's rising edge when divider multiplexer 216 selects signal 217. Falling-edge resampling flip-flop 226 may output an $I_2$ signal as signal 227 that is aligned to the falling edge after the VCO signal's rising edge when divider multiplexer 216 selects the output signal 257 of delay flip-flop 214.

Figure 3:
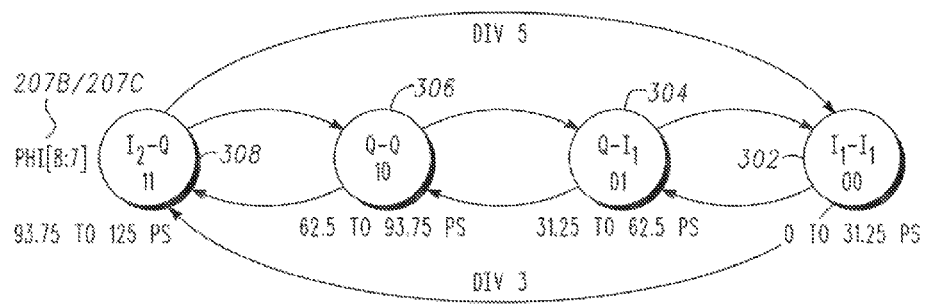
FIG. 3 is a state diagram of certain selection units of the DTC of FIG. 2 in accordance with some embodiments.

FIG. 3 is a state diagram that illustrates that state of multiplexers 232 and 234 of FIG. 2. As illustrated in FIG. 2, multiplexer 234 and divider multiplexer 216 are controlled by control word bit 207B. Multiplexer 232 is controlled by control word bits 207B and 207C through the use of XOR gate 210 (FIG. 2).

In this example, N may be 2 and the divider 212 may be arranged to divide by 2N−1 (e.g., a divide by three (DIV 3)) when transitioning from right to left in FIG. 3. Initially at state 302 (code 00), both multiplexers 232 and 234 output the $I_1$ signal 227 from flip-flop 226 (the I FF). Thus the output signal is aligned to the falling edge and the falling-edge resampling flip-flop 226 transitions before the rising-edge resampling flip-flop 220. Delay element 236 provides a delay of $T_{VCO}/4$ (i.e., $T_{LO}/16=31.25$ ps in the example), and the two edge signals 241 and 247 may have a difference of $T_{VCO}/4$ allowing the DCEI 206 to interpolate over that range (i.e., 0 to $T_{VCO}/4$).

At state 304 (code 01), multiplexer 232 outputs the rising-edge correlated signal 221 (the signal from flip-flop 220) effectively jumping 0.5 VCO cycle forward. At state 304, multiplexer 234 outputs the $I_1$ signal 227 (the signal from flip-flop 226). This provides a time difference of $T_{VCO}/4$ allowing the edge signals 241 and 247 to cover the range from $T_{VCO}/4$ to $T_{VCO}/2$.

At state 306 (code 10), multiplexer 234 now outputs rising-edge correlated signal 221 (from flip-flop 220) and multiplexer 232 outputs the rising-edge correlated signal 221 (from flip-flop 220) to cover the range between $T_{VCO}/2$ to $3*T_{VCO}/4$. During state 306 both multiplexers 232 and 234 are outputting the rising-edge correlated signal 221.

During state 306, the divider multiplexer 216 (FIG. 2) may be transitioned from providing the $I_1$ signal 217 to providing the $I_2$ signal 257 to arrive at state 308 (code 11) so that the output from flip-flop 226 (the I FF) is provided after the output of flip-flop 220 (the Q FF) by $T_{VCO}/2$. During state 308, multiplexer 232 selects falling-edge correlated signal 227 (now the $I_2$ signal 257) to cover a range from $3*T_{VCO}/4$ to $1*T_{VCO}$ (e.g., 125 ps in this example.)

Continuing this process would suggest that the next state is for both multiplexers 232 and 234 to output the $I_2$ signal 257; however this would be identical to both flip-flops 220 and 226 outputting the $I_1$ signal 217 and at the same time the division ratio of the divider 212 for one cycle is changed to divide by five (DIV 5) for transitioning from the left to the right in FIG. 3. The divider 212 may be arranged to divide by 2N−1=5 (e.g., divide by 5)

Now since the divider 212 counts five cycles and at the same cycle the divider multiplexer 216 is set back one cycle, flip-flop 226 (the I-FF) may still display a division by four, but at flip-flop 220 (the Q-FF) there is a division by five, the next state will cover the range of $1*T_{VCO}$ to $1.25T_{VCO}$ and the process may be repeated until 360 degrees, or more, of coverage is obtained (i.e., thus unwrapping the phase).

Transitioning in the opposite direction from state 304 (code 00) (that covers the range 0-0.25 $T_{VCO}$) to state 308 (code 11) (that covers the range −0.25$T_{VCO}$ to 0) is similar but the division ratio may be set to three (Div 3) and the divider multiplexer 216 may be configured to change to output the $I_2$ signal 257 rather than the $I_1$ signal 217. In this situation, the DTC 200 may start with flip-flop 226 outputting the $I_1$ signal (as signal 227) before flip-flop 220 outputs the Q-signal (as signal 221) and transitions the divider multiplexer 216 to provide the $I_2$ signal 257 at the same time resulting in a division by four at the output of flip-flop 226 (signal 227) and a division by three at flip-flop 220 (signal 221).

As illustrated in FIG. 2, the divider multiplexer 216 has the same control as the multiplexer 234 (i.e., control word bit 207B). Thus, when multiplexer 234 is arranged to select the output signal 227, the divider multiplexer 216 is arranged to select the $I_1$ signal 217. When multiplexer 234 is arranged to select rising-edge correlated signal 221, the divider multiplexer 216 is arranged to select the $I_2$ signal.

Referring back to FIG. 1, the programmable divider 212 may be arranged to divide the VCO signal 201 by a value at each cycle based on the control word bits 207A (e.g., Phi[10:9]—the ninth and tenth bits). Control word bits 207A may be the most significant bits (MSBs) of the control word 207 (e.g., the three MSBs of a 14-bit phase word), although this is not a requirement. Since the programmable divider 212 is a 2N+/−1 divider, it may divide by N to cover the present VCO cycle and may divide by N+1 to cover the next VCO cycle. For example if the VCO is at 8 GHz and N=4, the output of the divider 212 (signals 215 and 217) is at 2 GHz. To cover a 0-125 pico-second (ps) range the divider 212 is arranged to divide by N. When crossing into the 125-250 ps range, the divider 212 is arranged to divide by N+1 once which adds a full VCO cycle that changes the range (i.e., phase in an accumulation of the frequency).

Control words bit 207B (e.g., Phi[8]—the eighth bit) may comprise a next bit of the control word 207 after control word bits 207A. Control word bit 207C (e.g., Phi[7]—the seventh bit) may comprise a next bit of the control word 207 after control word bit 207B. Control word bits 207D (e.g., Phi[7:0]—bits zero through seven) may comprise the least significant bits (LSBs) of the control word 207.

In these embodiments, the DCEI 206 may generate fine bits phase control for the DTC 102 (FIG. 1) by interpolating between existing edges, unlike conventional techniques that use constant delay control. The DCEI 206 may also be frequency independent and provide a true phase interpolation. In these embodiments, the DCEI 206 may be fed by any two adjacent edges of the first and the second edge signals 241 and 247 from the coarse phase control portion of the DTC 200. The two adjacent may have a time delay of delta between them.

In some of these embodiments, the edges may be fed to an array 242 of 2K controlled inverters of the DCEI 206 that are all shorted at their outputs. The array 242 of controlled inverters may be considered an array of K 2-to-1 MUX cells. K may be the number of bits of control word bits 207D. Control bits 207D may be arranged to control the number of inverters that are fed by the first edge and the number that are fed by the second edge. The logic may be complementary so in total always K inverters are on, M are fed by the first edge and K-M inverters are fed by the second edge. As long as the spacing between the edges is less or equal the rise/fall time, the output edge location may be approximately interpolated with a resolution step of delta/K.

In some embodiments, K may be 128, although this is not a requirement. In these embodiments, the K multiplexers may be arranged in parallel with separate control for each multiplexer for interpolation of the edge signals based on the control word bits 207D.

Although DTC 200 is illustrated as having several separate functional elements, one or more of the functional elements may be combined and may be implemented by combinations of software-configured elements, such as processing elements including digital signal processors (DSPs), and/or other hardware elements.

In some embodiments, the DTC may be arranged to generate a fine phase-modulated output signal based on a control word. In these embodiments, the DTC may comprise a programmable divider to divide an oscillator signal to generate first and second divider signals. The DTC may also comprise resample circuitry comprising a rising-edge resampling flip-flop to sample the first divider signal to provide a rising-edge correlated signal and a falling-edge resampling flip-flop to sample a divider unit output signal to provide a falling-edge correlated signal. The DTC may also comprise a divider unit arranged to provide one of the second divider signal and a delayed version of the second divider signal as the divider unit output signal. The DTC may also comprise a first selection unit to select between the rising-edge correlated signal and the falling-edge correlated signal based on first and second predetermined bits of the control word to generate a first edge signal. The DTC may also comprise a second selection unit to select between the rising-edge correlated signal and the falling-edge correlated signal based on the second predetermined bits of the control word. The DTC may also comprise a delay element to delay an output of the second selection unit by a quarter cycle to generate a second edge signal. The DTC may also comprise a digitally-controlled edge interpolator (DCEI) to generate the fine phase-modulated output signal based on an edge interpolation between the first and second edge signals.

In some embodiments, the divider is multi-modulus divider (MMD) arranged to perform a divide by 2N+/−1 operation the oscillator signal based on most significant bits (MSBs) of the control word to generate the first and second divider signals.

In some embodiments, the second predetermined bits cause the divider unit to provide the second divider signal, the falling-edge resampling flip-flop is arranged to provide an $I_1$ signal that is aligned to the falling edge of the oscillator signal before the rising edge of the oscillator signal. When the second predetermined bits cause the divider unit to provide the delayed version of the second divider signal, the falling-edge resampling flip-flop is arranged to provide an $I_2$ signal that is aligned to the falling edge of the oscillator signal after the rising edge of the oscillator signal.

In some embodiments, the divider is configured to divide the oscillator signal by 2N−1 to cover a first 180/N degrees of phase of the oscillator signal, and the divider to divide the oscillator signal by 2N+1 to cover a second 180/N degrees of phase of the oscillator signal. In these embodiments, N may be a whole number ranging from 1 to 5.

In some embodiments, the DCEI comprises an array of inverters controlled by the least significant bits (LSBs) of the control word to interpolate between edges of the first and second edge signals and to provide an output edge corresponding to the fine phase-modulated output signal with a resolution of delta/K. Delta is a time delay between the first and second edge signals and K is a number of the LSBs.

In some embodiments, the rising-edge correlated signal and the falling-edge correlated signal have a time difference of half a cycle of the oscillator signal. The delayed version of the second divider signal is delayed by +/− half the cycle of the oscillator signal. The first selection unit is to select between the rising-edge correlated signal and the falling-edge correlated signal based on an exclusive-or (XOR) of the first and second predetermined bits of the control word to generate the first edge signal.

In some embodiments, a DTC is arranged to generate a fine phase-modulated output signal based on a control word. In these embodiments, the DTC comprises a multi-modulus divider (MMD) arranged to perform a divide by 2N+/−1 operation on an oscillator signal to generate divider signals. The DTC may also comprise logic circuitry arranged to sample the divider signals to provide rising and falling edge correlated signals, and select between the rising and falling edge correlated signals based on first and second predetermined bits of a control word to generate edge signals. The DTC may also comprise an edge interpolator arranged to generate the fine phase-modulated output signal based on an edge interpolation between the edge signals.

In some embodiments, the MMD is arranged to generate first and second divider signals from the oscillator signal. The logic circuitry may include resample circuitry comprising a rising-edge resampling flip-flop to sample the first divider signal to provide the rising-edge correlated signal and comprising a falling-edge resampling flip-flop to sample a divider unit output signal to provide the falling-edge correlated signal, a divider unit arranged to provide one of the second divider signal and a delayed version of the second divider signal as the divider unit output signal, a first selection unit to select between the rising-edge correlated signal and the falling-edge correlated signal based on the first and second predetermined bits of the control word to generate a first edge signal, a second selection unit to select between the rising-edge correlated signal and the falling-edge correlated signal based on the second predetermined bits of the control word, and a delay element to delay an output of the second selection unit by a quarter VCO cycle to generate a second edge signal.

In some embodiments, the edge interpolator comprises a digitally-controlled edge interpolator (DCEI) to generate the fine phase-modulated output signal based on an edge interpolation between the first and second edge signals. The DCEI comprises an array of inverters controlled by the least significant bits (LSBs) of the control word to interpolate between edges of the first and second edge signals and to provide an output edge corresponding to the fine phase-modulated output signal with a resolution of delta/K. Delta is a time delay between the first and second edge signals and K is a number of the LSBs.

In some embodiments, the second predetermined bits cause the divider unit to provide the second divider signal, the falling-edge resampling flip-flop is arranged to provide an $I_1$ signal that is aligned to the falling edge of the oscillator signal before the rising edge of the oscillator signal. The second predetermined bits cause the divider unit to provide the delayed version of the second divider signal, the falling-edge resampling flip-flop is arranged to provide an $I_2$ signal that is aligned to the falling edge of the oscillator signal after the rising edge of the oscillator signal.

In some embodiments, the divider is configured to divide the oscillator signal by 2N−1 to cover a first 180/N degrees of phase of the oscillator signal, the divider is to divide the oscillator signal by 2N+1 to cover a second 180/N degrees of phase of the oscillator signal, and N is a whole number ranging from 1 to 5.

In some embodiments, a method for generating a fine phase-modulated output signal based on a control word is provided. In these embodiments, the method includes performing a divide by 2N+/−1 operation on an oscillator signal to generate first and second divider signals, sampling the first divider signal to provide a rising-edge correlated signal, sampling a divider unit output signal to provide a falling-edge correlated signal, providing one of the second divider signal and a delayed version of the second divider signal as the divider unit output signal, selecting between the rising-edge correlated signal and the falling-edge correlated signal based on first and second predetermined bits of a control word to generate a first edge signal, selecting between the rising-edge correlated signal and the falling-edge correlated signal based on the second predetermined bits of the control word, delaying an output of the second selection unit by a quarter VCO cycle to generate a second edge signal, and generating the fine phase-modulated output signal based on an edge interpolation between the first and second edge signals.

FIG. 4 is a block diagram of a mobile device in accordance with some embodiments. Mobile device 400 may include physical (PHY) layer circuitry 402 and media-access control (MAC) layer circuitry 404. The PHY layer circuitry 402 may utilize one or more antennas 401 for wireless communications. In accordance with some embodiments, the PHY layer circuitry 402 may include one or more transmitters, such as digital transmitter 100 (FIG. 1), which may include a DTC, such as DTC 200 (FIG. 1).

In some LTE embodiments, the mobile device 400 may be user equipment (UE) and configured to transmit and receive OFDM communication signals over multicarrier communication channels in accordance with an OFDMA communication technique. The OFDM signals may comprise a plurality of orthogonal subcarriers.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A digital-to-time converter (DTC) arranged to generate a fine phase-modulated output signal based on a control word, the DTC comprising:
 a multi-modulus divider (MMD) arranged to perform a "divide by 2N+/−1 operation" on an oscillator signal to generate divider signals whose frequencies are 1/(2N+1) and 1/(2N−1) of a frequency of the oscillator signal, where N is a whole number;
 logic circuitry arranged to sample the divider signals to provide rising and falling edge correlated signals, and select between the rising and falling edge correlated signals based on first and second predetermined bits of a control word to generate edge signals; and
 an edge interpolator arranged to generate fine phase-modulated output signal based on an edge interpolation between the edge signals.

2. The DTC of claim 1 wherein the MMD is arranged to generate first and second divider signals from the oscillator signal;
 wherein the logic circuitry includes:
  resample circuitry comprising rising-edge resampling logic to sample the first divider signal to provide the rising-edge correlated signal and comprising falling-edge resampling logic to sample a divider unit output signal to provide the falling-edge correlated signal;
  a divider unit arranged to provide one of the second divider signal and a delayed version of the second divider signal as the divider unit output signal;
  a first selection unit to select between the rising-edge correlated signal and the falling-edge correlated signal based on the first and second predetermined bits of the control word to generate a first edge signal;
  a second selection unit to select between the rising-edge correlated signal and the falling-edge correlated signal based on the second predetermined bits of the control word; and
  a delay element to delay an output of the second selection unit by a quarter cycle to generate a second edge signal.

3. The DTC of claim 2 wherein the edge interpolator comprises a digitally-controlled edge interpolator (DCEI) to generate the fine phase-modulated output signal based on an edge interpolation between the first and second edge signals,
 wherein the DCEI comprises an array of inverters controlled by the least significant bits (LSBs) of the control word to interpolate between edges of the first and second edge signals and to provide an output edge corresponding to the fine phase-modulated output signal with a resolution of delta/K, and
 wherein delta is a time delay between the first and second edge signals and K is a number of the LSBs.

4. The DTC of claim 2 wherein when the second predetermined bits cause the divider unit to provide the second divider signal, the falling-edge resampling logic is arranged to provide an $I_1$ signal that is aligned to the falling edge of the oscillator signal before the rising edge of the oscillator signal, and
 wherein when the second predetermined bits cause the divider unit to provide the delayed version of the second divider signal, the falling-edge resampling logic is arranged to provide an $I_2$ signal that is aligned to the falling edge of the oscillator signal after the rising edge of the oscillator signal.

5. The DTC of claim 2 wherein the divider is configured to divide the oscillator signal by 2N−1 to cover a first 180/N degrees of phase of the oscillator signal,
 wherein the divider is to divide the oscillator signal by 2N+1 to cover a second 180/N degrees of phase of the oscillator signal, and
 wherein N is a whole number ranging from 1 to 5.

6. A digital-to-time converter (DTC) arranged to generate a fine phase-modulated output signal based on a control word, the DTC comprising:
 a programmable divider to divide an oscillator signal to generate first and second divider signals;
 a resample circuitry comprising a rising-edge resampling logic to sample the first divider signal to provide a rising-edge correlated signal and comprising a falling-edge resampling logic to sample a divider unit output signal to provide a falling-edge correlated signal;
 a divider unit arranged to provide one of the second divider signal and a delayed version of the second divider signal as the divider unit output signal;
 a first selection unit to select between the rising-edge correlated signal and the falling-edge correlated signal based on first and second predetermined bits of the control word to generate a first edge signal;
 a second selection unit to select between the rising-edge correlated signal and the falling-edge correlated signal based on the second predetermined bits of the control word;
 a delay element to delay an output of the second selection unit by a quarter cycle to generate a second edge signal; and
 an interpolator to generate the fine phase-modulated output signal based on an edge interpolation between the first and second edge signals.

7. The DTC of claim 6 wherein the programmable divider is multi-modulus divider (MMD) arranged to perform a "divide by 2N+/−1 operation" on the oscillator signal based on most significant bits (MSBs) of the control word to generate the first and second divider signals whose frequencies are 1/(2N+1) and 1/(2N−1) of a frequency of the oscillator signal, where N is a whole number.

8. The DTC of claim 7 wherein upon the second predetermined bits causing the divider unit to provide the second divider signal, the falling-edge resampling logic is arranged to provide an $I_1$ signal that is aligned to the falling edge of the oscillator signal before the rising edge of the oscillator signal, and
 wherein upon the second predetermined bits causing the divider unit to provide the delayed version of the second divider signal, the falling-edge resampling logic is arranged to provide an $I_2$ signal that is aligned to the falling edge of the oscillator signal after the rising edge of the oscillator signal.

9. The DTC of claim 8 wherein the divider is configured to divide the oscillator signal by 2N−1 to cover a first 180/N degrees of phase of the oscillator signal,
 wherein the divider to divide the oscillator signal by 2N+1 to cover a second 180/N degrees of phase of the oscillator signal, and
 wherein N is a whole number ranging from 1 to 5.

10. The DTC of claim 9 wherein the interpolator is a digitally-controlled edge interpolator (DCEI) that comprises an array of inverters controlled by the least significant bits (LSBs) of the control word to interpolate between edges of the first and second edge signals and to provide an output edge corresponding to the fine phase-modulated output signal with a resolution of delta/K, where delta is a time delay between the first and second edge signals and K is a number of the LSBs.

11. The DTC of claim 9 wherein the rising-edge correlated signal and the falling-edge correlated signal have a time difference of half a cycle of the oscillator signal,
wherein the delayed version of the second divider signal is delayed by + or − half the cycle of the oscillator signal, and
wherein the first selection unit is to select between the rising-edge correlated signal and the falling-edge correlated signal based on an exclusive-or (XOR) of the first and second predetermined bits of the control word to generate the first edge signal.

12. A method for generating a fine phase-modulated output signal based on a control word, the method comprising:
performing a "divide by 2N+/−1 operation" an oscillator signal to generate first and second divider signals whose frequencies are 1/(2N+1) and 1/(2N−1) of a frequency of the oscillator signal, where N is a whole number;
sampling the first divider signal to provide a rising-edge correlated signal;
sampling a divider unit output signal to provide a falling-edge correlated signal;
providing one of the second divider signal and a delayed version of the second divider signal as the divider unit output signal;
selecting between the rising-edge correlated signal and the falling-edge correlated signal based on first and second predetermined bits of a control word to generate a first edge signal;
selecting between the rising-edge correlated signal and the falling-edge correlated signal based on the second predetermined bits of the control word;
delaying an output of the second selection unit by a quarter cycle to generate a second edge signal; and
generating the fine phase-modulated output signal based on an edge interpolation between the first and second edge signals.

13. The method of claim 12 wherein the "divide by 2N+/−1 operation" is performed based on most significant bits (MSBs) of the control word to generate the first and second divider signals,
wherein when the second predetermined bits cause the second divider signal to be provided, falling-edge resampling logic is arranged to provide an $I_1$ signal that is aligned to the falling edge of the oscillator signal before the rising edge of the oscillator signal, and
wherein when the second predetermined bits cause the delayed version of the second divider signal to be provided, the falling-edge resampling logic is arranged to provide an $I_2$ signal that is aligned to the falling edge of the oscillator signal after the rising edge of the oscillator signal.

14. A digital transmitter comprising:
a digital power amplifier (P/A) arranged to generate wireless signals based on an amplitude control signal and a phase-modulated signal; and
a digital-to-time converter (DTC) arranged to generate the fine phase-modulated output signal based on a control word,
wherein the DTC comprises:
a multi-modulus divider (MMD) arranged to perform a "divide by 2N+/−1 operation" on an oscillator signal to generate divider signals whose frequencies are 1/(2N+1) and 1/(2N−1) of a frequency of the oscillator signal, where N is a whole number;
logic circuitry arranged to sample the divider signals to provide rising and falling edge correlated signals, and select between the rising and falling edge correlated signals based on first and second predetermined bits of a control word to generate edge signals; and
an edge interpolator arranged to generate the fine phase-modulated output signal based on an edge interpolation between the edge signals.

15. The digital transmitter of claim 14 wherein the MMD is arranged to generate first and second divider signals from the oscillator signal;
wherein the logic circuitry includes:
resample circuitry comprising rising-edge resampling logic to sample the first divider signal to provide the rising-edge correlated signal and comprising falling-edge resampling logic to sample a divider unit output signal to provide the falling-edge correlated signal;
a divider unit arranged to provide one of the second divider signal and a delayed version of the second divider signal as the divider unit output signal;
a first selection unit to select between the rising-edge correlated signal and the falling-edge correlated signal based on the first and second predetermined bits of the control word to generate a first edge signal;
a second selection unit to select between the rising-edge correlated signal and the falling-edge correlated signal based on the second predetermined bits of the control word; and
a delay element to delay an output of the second selection unit by a quarter cycle to generate a second edge signal.

16. The digital transmitter of claim 15 wherein the digital transmitter is part of a mobile communication device and is coupled to an antenna configured for transmission of orthogonal frequency division multiplexed (OFDM) signals in a 3GPP LTE network.

* * * * *